US008732650B2

(12) United States Patent
Chang et al.

(10) Patent No.: US 8,732,650 B2
(45) Date of Patent: *May 20, 2014

(54) METHOD AND APPARATUS FOR VERSATILE CONTROLLABILITY AND OBSERVABILITY IN PROTOTYPE SYSTEM

(75) Inventors: Yingtsai Chang, Fremont, CA (US); Sweyyan Shei, Cupertino, CA (US); Hung Chun Chiu, Fremont, CA (US); Hwa Mao, Taipei (TW); Ming Yang Wang, Lafayette, CA (US); Yuchin Hsu, Cupertino, CA (US)

(73) Assignees: Synopsys Taiwan Co., Ltd., Chupei, Hsinchu Hsien (TW); Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/597,997

(22) Filed: Aug. 29, 2012

(65) Prior Publication Data
US 2013/0035925 A1    Feb. 7, 2013

Related U.S. Application Data

(63) Continuation-in-part of application No. 13/025,809, filed on Feb. 11, 2011, now Pat. No. 8,281,280.

(60) Provisional application No. 61/304,328, filed on Feb. 12, 2010, provisional application No. 61/561,045, filed on Nov. 17, 2011.

(51) Int. Cl.
    *G06F 17/50* (2006.01)
(52) U.S. Cl.
    USPC ........... 716/136; 716/106; 716/108; 716/111; 716/116; 716/117

(58) Field of Classification Search
    USPC .................. 716/106, 108, 111, 116, 117, 136
    See application file for complete search history.

(56) References Cited

U.S. PATENT DOCUMENTS

| 5,425,036 | A | 6/1995 | Liu et al. |
| 5,457,408 | A | 10/1995 | Leung |
| 5,896,494 | A | 4/1999 | Perugini et al. |
| 5,991,897 | A | 11/1999 | Perugini et al. |

(Continued)

OTHER PUBLICATIONS

Mao, H., "Prototyping the next-generation SoC verification platform", *EDA & Development, Components in Electronics*, Mar. 2011, 2 pages.

(Continued)

*Primary Examiner* — Sun Lin
(74) *Attorney, Agent, or Firm* — Kilpatrick Townsend and Stockton LLP

(57) ABSTRACT

A method for emulating a circuit design includes receiving, at an emulation interface, signal values associated with probed signals from a verification module of a custom prototype board which can be described by at least one board description file and can comprise at least one field programmable gate array for emulating the circuit design. The method can also include processing, the probed signal values associated with a portion of the circuit design being emulated, the emulation interface being capable of being configured to provide timing and control information to at least the verification module, and can comprise a controller and a memory device, with the controller being capable of being configured to receive the probed signal values. The method can further include storing the processed information and transmitting it to the host workstation.

24 Claims, 9 Drawing Sheets

Emulation Interface

(56) References Cited

U.S. PATENT DOCUMENTS

| | | |
|---|---|---|
| 6,002,868 A | 12/1999 | Jenkins et al. |
| 6,754,881 B2 | 6/2004 | Kuhlmann et al. |
| 6,842,729 B2 | 1/2005 | Sample et al. |
| 7,353,162 B2 | 4/2008 | Huang et al. |
| 7,673,265 B2 | 3/2010 | Akiba et al. |
| 8,281,280 B2 * | 10/2012 | Chang et al. .................. 716/136 |
| 2011/0202894 A1 | 8/2011 | Chang et al. |
| 2013/0117007 A1 | 5/2013 | Chang et al. |
| 2013/0227509 A1 | 8/2013 | Chang et al. |

OTHER PUBLICATIONS

Office Action mailed Apr. 13, 2012 for U.S. Appl. No. 13/025,809.

Amendment filed May 14, 2012 for U.S. Appl. No. 13/025,809.

Notice of Allowance mailed May 31, 2012 for U.S. Appl. No. 13/025,809.

Non-Final Office Action for U.S. Appl. No. 13/730,543, mailed on May 23, 2013, 8 pages.

\* cited by examiner

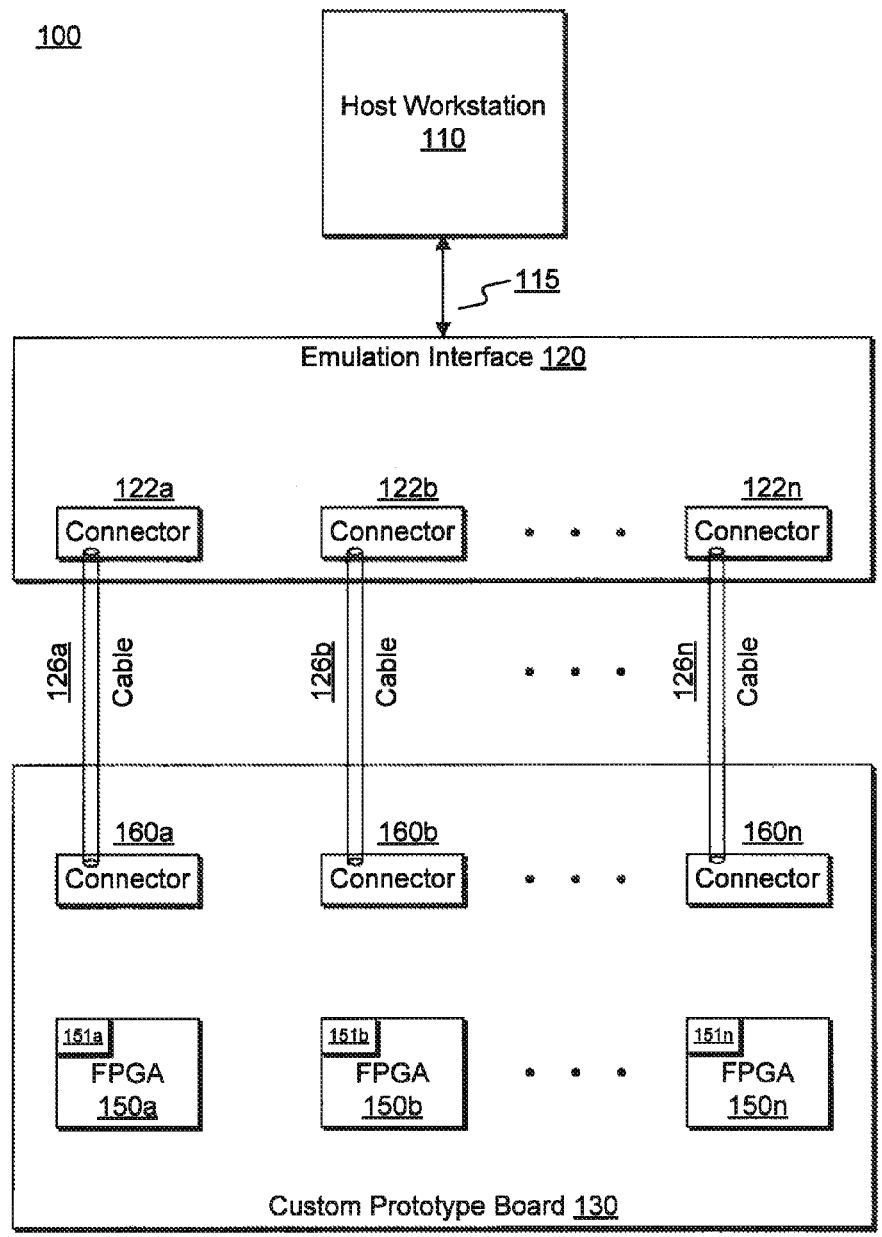
Figure 1: Prototype System with Custom Prototype Board with n FPGAs

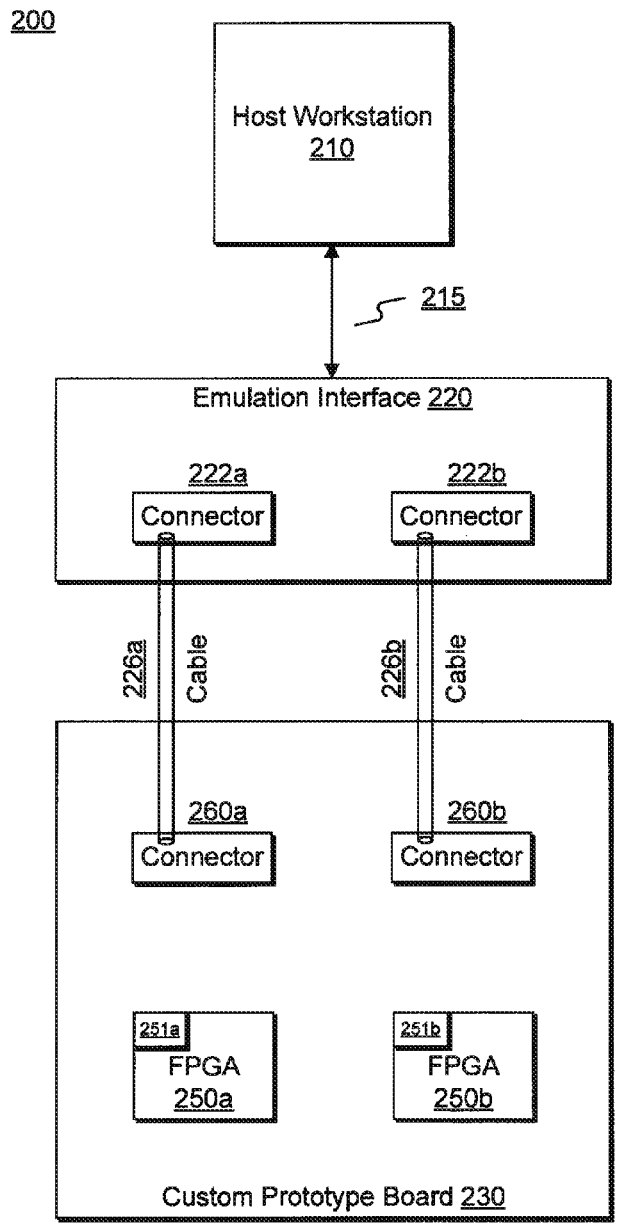
Figure 2: Prototype System with Custom Prototype Board with two FPGAs

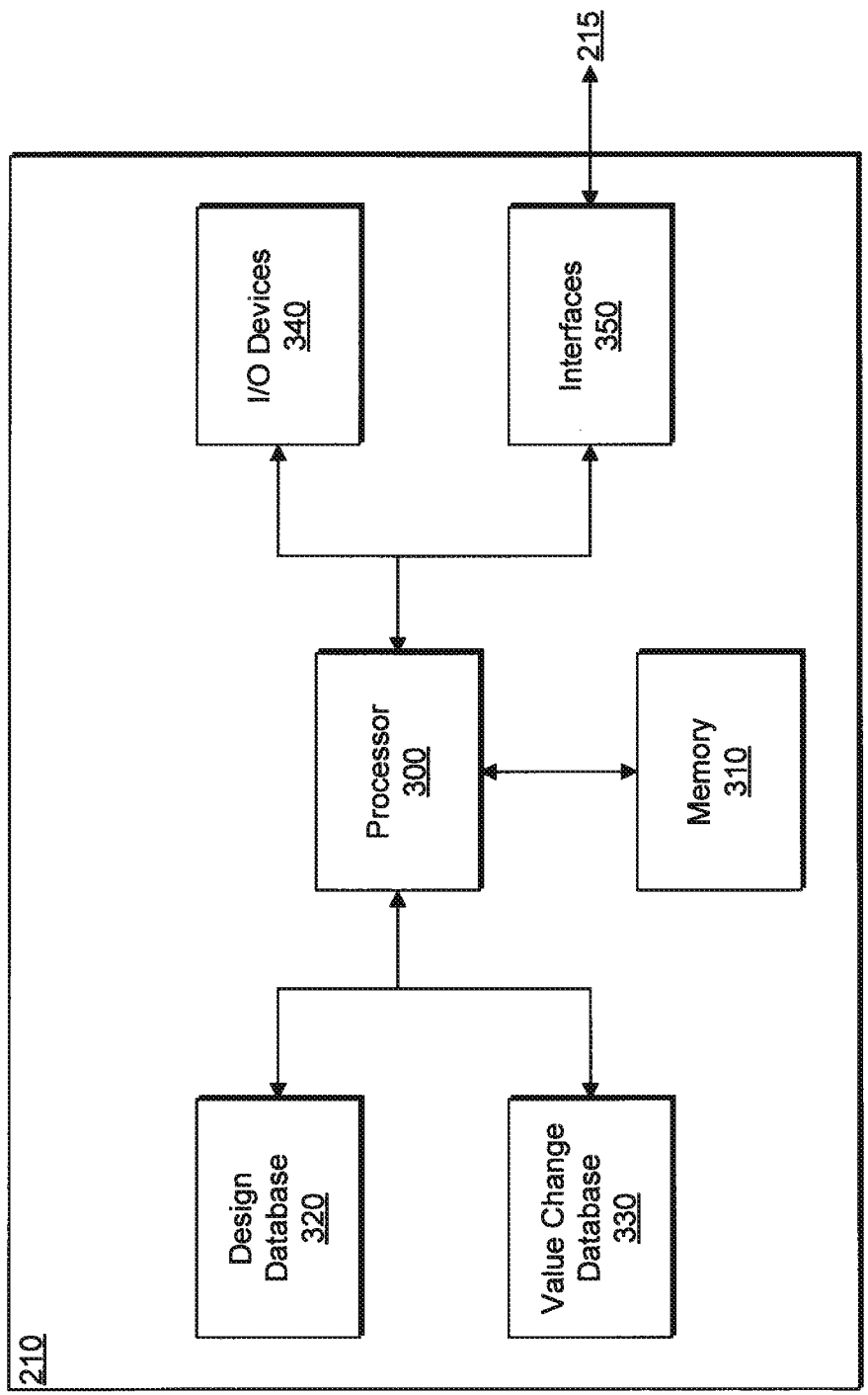
Figure 3: Host Workstation

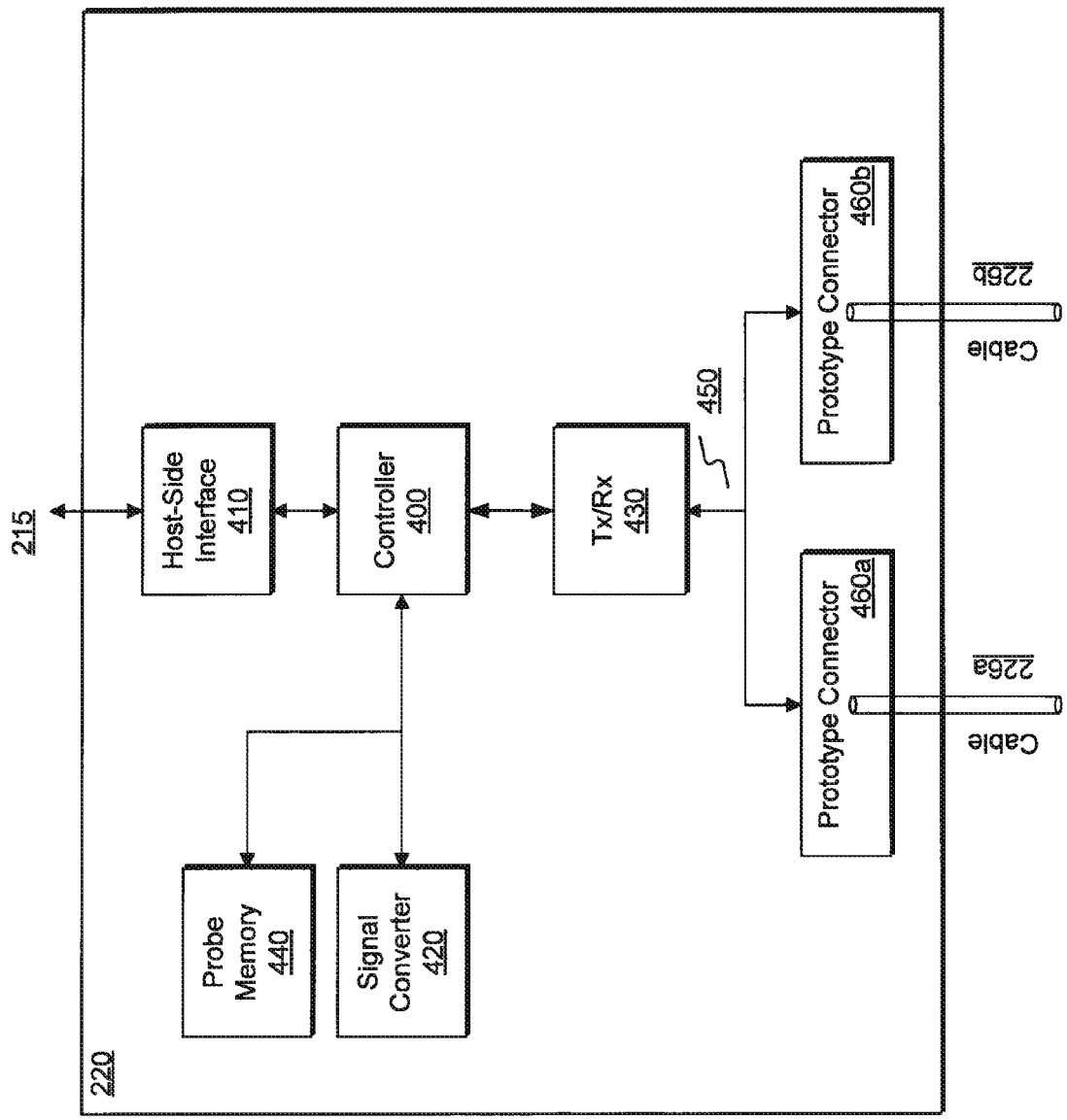
Figure 4: Emulation Interface

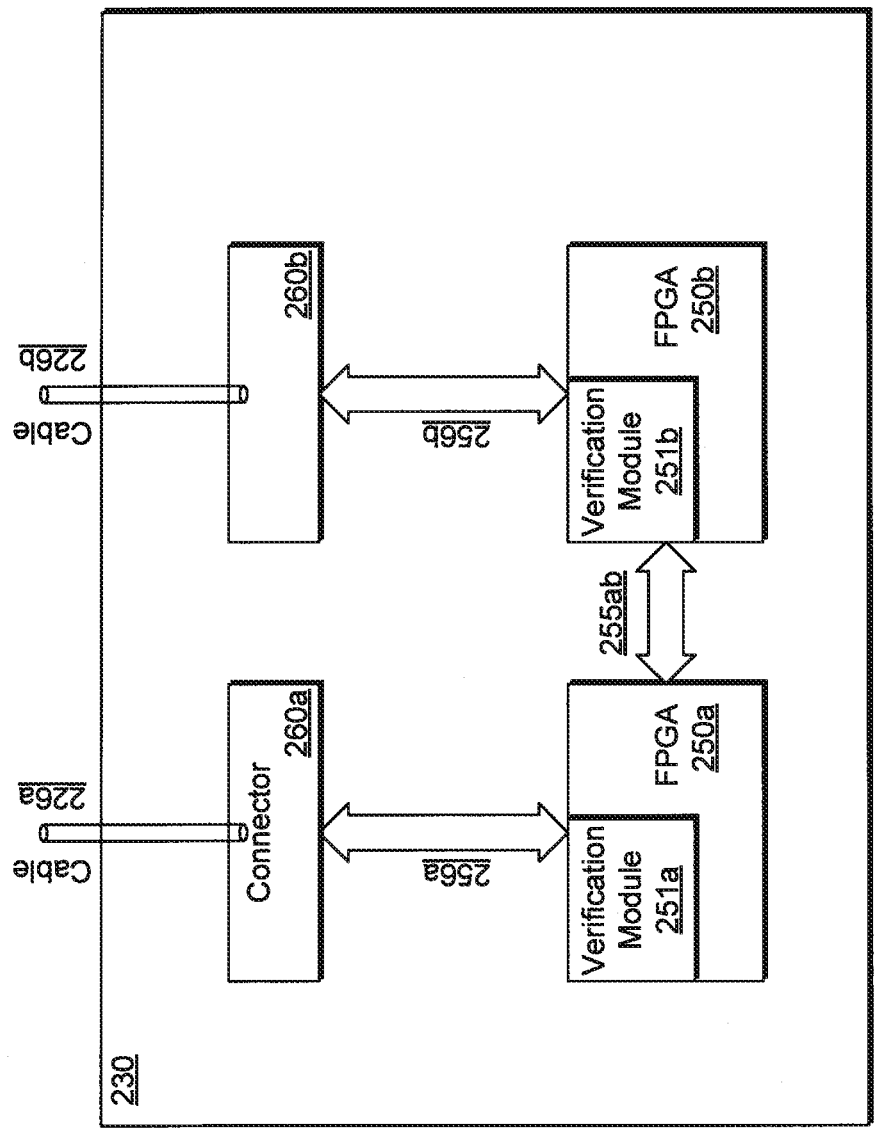
Figure 5: Custom Prototype Board

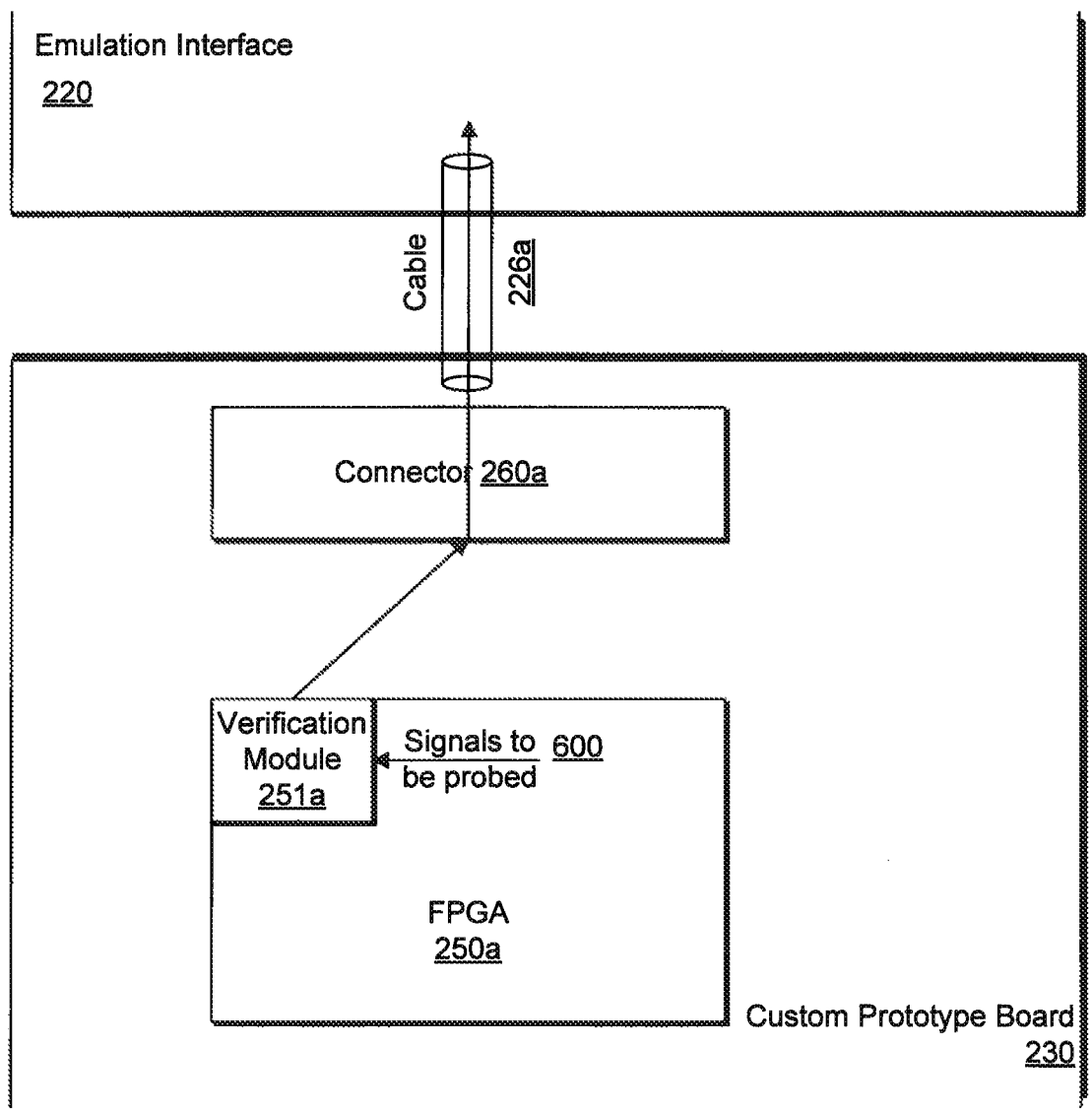
Figure 6: Signal Datapath

```
module custom_board (connector1_pins, connector2_pins);
wire [119:0] connector1_pins, connector2_pins;
inout [119:0] connector1_pins , connector2_pins;
wire local_sig1, local_sig2, ...

xc5vlx330 F1(.A1(connector1_pins[0]),
.A2(connector1_pins[1]),
.A3(local_sig1),
.A4(connector1_pins[2]),
....);

xc5vlx330 F2(.A1(connector2_pins[0]),
.A2(connector2_pins[1]),
.A3(local_sig1),
.A4(connector1_pins[2]),
....);

endmodule
```

Figure 7. Exemplary Board Description File in Verilog HDL

```
[custom_board.F1]
Device = xc5vlx330-ff1760
...
```

Figure 8. Exemplary description file for FPGA device type

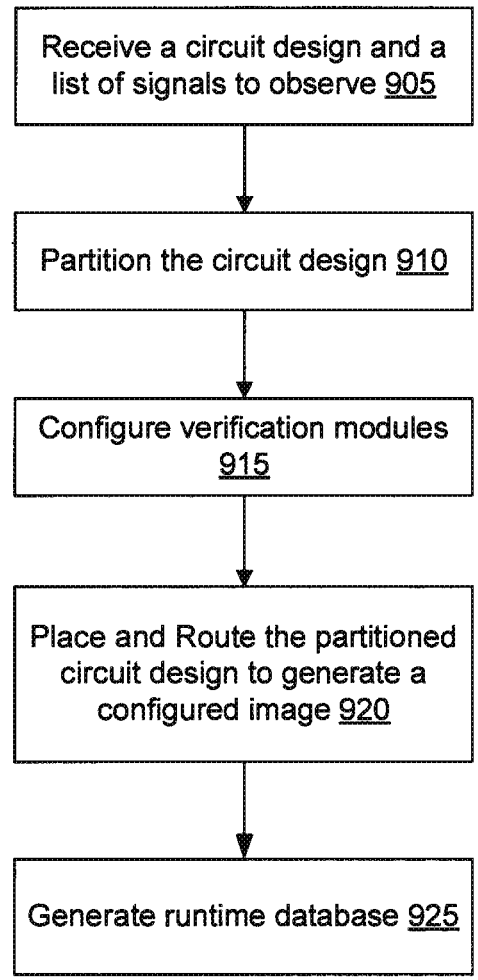
Figure. 9: Setup Flowchart

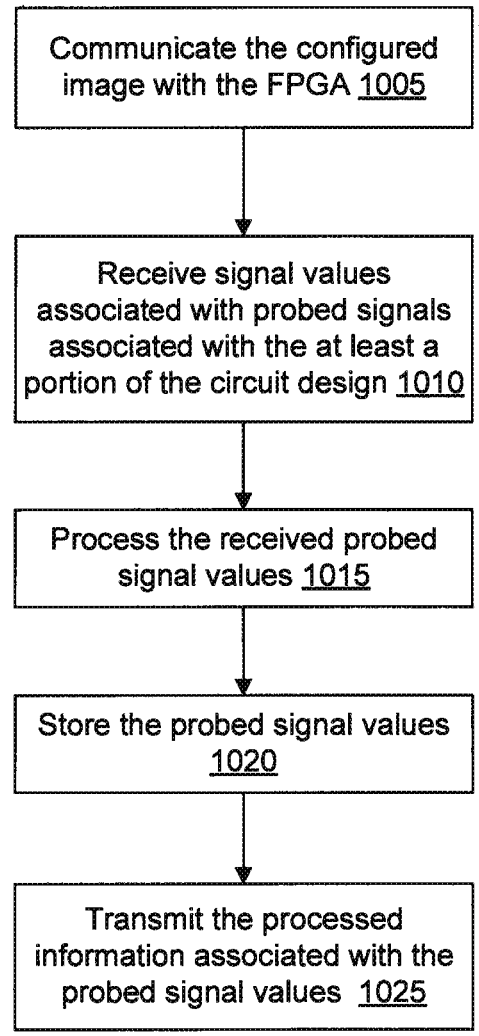
Figure. 10: Runtime Flowchart

METHOD AND APPARATUS FOR VERSATILE CONTROLLABILITY AND OBSERVABILITY IN PROTOTYPE SYSTEM

RELATED APPLICATIONS

This application is a continuation-in-part of and claims the benefit of priority from application Ser. No. 13/025,809 filed on Feb. 11, 2011, and entitled "Method and Apparatus for Versatile Controllability and Observability in Prototype System," now U.S. Pat. No. 8,281,280, issued Oct. 2, 2012, which further claims the benefit of priority of U.S. Provisional Application No. 61/304,328, filed Feb. 12, 2010, and titled "Method and Apparatus for Versatile Controllability and Observability in Prototype System," the contents of all of which are incorporated herein by reference in their entirety. This application also claims the benefit of priority of U.S. Provisional Application No. 61/561,045, filed on Nov. 17, 2011, and titled "Method and Apparatus for Versatile Controllability and Observability in Prototype System," the contents of all of which is incorporated herein by reference in its entirety.

TECHNICAL FIELD

The present disclosure generally relates to verification methods and systems for semiconductor or integrated circuit devices and, more specifically, to design verification systems and methods utilizing a prototype system.

BACKGROUND

Without limiting the scope of the disclosed embodiments, various semiconductor, circuit, and integrated circuit ("IC") devices, such as system-on-chip ("SoC") devices, are emulated or verified during their design and development processes. As an example, highly-integrated SoC devices may power or support a wide variety of products to allow various hardware, software, and/or device applications. To meet these demands, SoC devices continue to increase in size and complexity, and their capabilities and manufacturability are in part aided by advance semiconductor processing technologies and availabilities of verified or well-developed libraries, e.g. design or circuit intellectual property ("IP") libraries. The development of SoCs or other circuits or device in some cases nevertheless may increase the burdens on design verification processes, methods, or systems. In some cases, verification may consume a significant amount of time or resources during an SoC development cycle.

Circuit design verification approaches can vary. Given the expectation for speed, the various approaches of software development, hardware development, or system validation may provide varying levels of observability and control. Field programmable gate array ("FPGA") prototype systems, for example, can provide improved system execution time due to its hardware-based nature. Some FPGA verification systems, nevertheless, may lack the ability to isolate some of the root causes of discoverable errors for various reasons, such as due to the lack of visibility regarding certain signal values within the design. Depending on the environment, software, and hardware constraints in some cases, deficiencies in certain FPGA vendor-specific verification tools may include access to a limited number of signals, and limited sample capture depth. Even combined with an external logic analyzer, FPGA vendor-specific verification tools, in some instances, may lack sufficient capabilities to isolate root cause errors during design verification. Also, FPGA vendor-specific verification tools typically only work with their own FPGA device types and typically cannot be customized to other FPGA type devices.

It therefore may be desirable to have methods or apparatus that can meet the design verification demands of highly-integrated SoC or other circuit or IC devices in certain applications or can provide design verification systems having improved control and/or observability of signals on FPGA-based electronic prototype systems. Also, it may be desirable to have a capability of advanced debugging on customized prototype systems such that a design or SoC verification flow can be applied for various types of FPGA devices.

SUMMARY

Consistent with some embodiments of the present disclosure, a system for emulating a circuit design can comprise a custom prototype board comprising at least one field programmable gate array ("FPGA") for emulating the circuit design. The at least one FPGA of the custom prototype board can be capable of emulating or configured to emulate at least a portion of the circuit design. The at least one FPGA can also be capable of providing or configured to include an associated verification module for providing timing and control information to the at least a portion of the circuit design and probing signals associated with the at least a portion of the circuit design. The custom prototype board can be described by at least one board description file. The system can also comprise a host workstation configured to provide image data representative of the at least a portion of the circuit design being emulated and of the verification module. The image data can be based at least in part on the at least one board description file and to be downloaded to the at least one FPGA on the custom prototype board. The system can further comprise an emulation interface coupled between the host workstation and the custom prototype board and the emulation interface can also be capable of providing or configured to provide timing and control information to at least the verification module. The emulation interface can further comprise a controller and a memory device where the controller can be configured to receive and process signal values associated with the probed signals for storing in the memory device.

Consistent with some embodiments of the present disclosure, an emulation interface can comprise a controller coupled between a host workstation and a custom prototype board which can be configured to receive or capable of receiving, after a configuration, signal values associated with probed signals from a verification module of the custom prototype board. The probed signal values can be associated with at least a portion of a circuit design being emulated by the custom prototype board. The emulation interface can also comprise a memory device that can be coupled with the controller to store information associated with the probed signal values, wherein the custom prototype board coupled with the controller comprises at least one field programmable gate array ("FPGA"), the custom prototype board can be described by at least one board description file. The emulation interface can further be configured or capable of being configured such that the controller can be configured or configured to provide timing and control information to at least the verification module.

Consistent with some embodiments of the present disclosure, a method for emulating a circuit design can include receiving, at an emulation interface, signal values associated with probed signals from a verification module of a custom prototype board, the custom prototype board comprising at least one field programmable gate array ("FPGA") for emulating the circuit design, the at least one FPGA of the custom prototype board being configured to or being capable of being configured to emulate at least a portion of the circuit design, the custom prototype board being described by at least one board description file. The method can also include processing, by the emulation interface, the probed signal values, the probed signal values being associated with at least a portion of the circuit design being emulated, the emulation interface being coupled between a host workstation and the custom prototype board, the emulation interface being configured to or being capable of being configured to provide timing and control information to at least the verification module, the emulation interface comprising a controller and a memory device, the controller being configured to or being capable of being configured to receive the probed signal values. The method can further include storing, by the emulation interface, processed information from processing the probed signal values by the controller and transmitting, by the emulation interface, the processed information to the host workstation.

Additional features and advantages of the disclosure will be set forth in part in the description which follows. The features and advantages of the disclosed embodiments will be realized and attained by the elements and combinations particularly pointed out in the appended claims.

BRIEF DESCRIPTION OF THE DRAWINGS

The accompanying drawings, which are incorporated in and constitute a part of this specification, illustrate embodiments disclosed herein, which, together with the description, serve to explain the principles of the disclosed embodiments.

FIG. 1 illustrates an exemplary prototype system diagram consistent with disclosed embodiments comprising n FPGA chips.

FIG. 2 illustrates an exemplary prototype system diagram consistent with disclosed embodiments comprising two FPGA chips.

FIG. 3 illustrates a block diagram of an exemplary host workstation consistent with disclosed embodiments.

FIG. 4 illustrates a block diagram of an exemplary emulation interface consistent with disclosed embodiments.

FIG. 5 illustrates a block diagram of an exemplary custom prototype board consistent with disclosed embodiments.

FIG. 6 illustrates a block diagram of an exemplary signal data path consistent with disclosed embodiments.

FIGS. 7 and 8 illustrate exemplary board description files consistent with disclosed embodiments.

FIG. 9 illustrates a setup flowchart of an exemplary method for implementing a prototype system consistent with disclosed embodiments.

FIG. 10 illustrates a runtime flowchart of an exemplary method for implementing a prototype system consistent with disclosed embodiments

DETAILED DESCRIPTION

Reference will now be made in detail to disclosed embodiments illustrated in the accompanying drawings. Wherever possible, the same reference numbers will be used throughout the drawings to refer to the same or like portions. It should be noted that the drawings are in greatly simplified form and are not to precise scale.

In the following description, the terms "coupled" and "connected," along with their derivatives, can be used. It should be understood that these terms are not intended as synonyms for each other. Rather, in particular embodiments, "connected" and/or "coupled" can be used to indicate that two or more elements are in direct physical or electronic contact with each other. However, "coupled" can also mean that two or more elements are not in direct contact with each other, but yet still cooperate, communicate, and/or interact with each other.

FIG. 1 illustrates an exemplary prototype system diagram 100 consistent with disclosed embodiments. By way of example, and as illustrated in FIG. 1, prototype system 100 can include a combination of hardware components, emulation interface, and a reconfigurable verification module adapted to improve visibility and control of a device under test during a design verification process. For example, in some embodiments, prototype system 100 can include host workstation 110, emulation interface 120, and custom prototype board (or interchangeably, custom prototype card) 130. In some embodiments, custom prototype board 130 can be any emulation hardware of customers/engineers/companies who use the board to emulate circuit designs. For example, one or more custom prototype boards may include one or more Field Programmable Gate Arrays ("FPGAs"), such as FPGAs 150a-150n, which may emulate a design, circuit, or device under test (DUT), and connectors 160a-160n. Additionally, verification modules 151a-151n can be configured or be capable of being configured and combined with partitioned portions of the design designated to each FPGA chip of 150a-150n. As shown in FIG. 1, custom prototype board 130 can include one or more FPGA chips (for example, FPGA chips 150a, 150b through 150n), one or more connectors (for example, connectors 160a, 160b, through 160n) and corresponding number of cables (for example, cables 126a, 126b, through 126n).

In some embodiments, the number of FPGA chips 150 can vary from a number as low as one to a large number n. An exemplary system comprising two FPGA chips, 250a and 250b, is illustrated by FIG. 2. Exemplary system of FIG. 2 also comprises two connectors, 260a and 260b, within custom prototype board 230, two connectors, 222a and 222b, within emulation interface 220, and two cables, 226a and 226b, coupling between custom prototype board 230 and emulation interface 220. For the rest of the detailed description, it is assumed that an exemplary prototype system includes custom prototype board 230 with two FPGA chips, 250a and 250b. This does not mean, however, that the disclosure is limited to custom prototype board 230 with two FPGA chips, 250a and 250b, but rather extends to custom prototype boards with any number of FPGA chips, as can be determined by a user.

Host workstation 210 can be coupled with emulation interface 220 over host communication channel 215 using an interface communication protocol, such as one of the computer interface standards. For example, in some embodiments, host communication channel 215 can be a wired communication method, such as Peripheral Component Interconnect (PCI) Express, IEEE 1394, Ethernet, or other interface methods allowing exchange of commands and data between host workstation 210 and emulation interface 220. Emulation interface 220 and custom prototype board 230 are coupled with cables 226a and 226b between connectors 260a and 260b on custom prototype board 230 and connectors 222a and 222b on emulation interface 220.

FIG. 3 illustrates a block diagram of an exemplary host workstation 210 consistent with disclosed embodiments. By way of example, and as illustrated in FIG. 3, host workstation 210 can include one or more of the following components: at least one processor 300, which can be configured or be capable of being configured to execute computer programs instructions to perform various prototype system instructions and methods, memory 310, which can be configured or be capable of being configured to store and provide information and computer program instructions, design database 320, which can be configured or be capable of being configured to maintain runtime software and design information, value-change database 330 to store information received from custom prototype board 230, Input/Output ("I/O") devices 340, and interfaces 350.

As used herein, the term "processor" can include an electric circuit that executes one or more instructions. For example, such a processor can include one or more integrated circuits, microchips, microcontrollers, microprocessors, embedded processor, all or part of a central processing unit (CPU), digital signal processors (DSP), FPGA or other circuit suitable for executing instructions or performing logic operations. Processor 300 can be a special purpose process in that it can be configured or be capable of being configured and programmed to operate as a verification processor programmed to exchange commands and data with custom prototype board 230. For example, processor 300 can act upon instructions and data output from memory 310, design database 320, value change database 330, I/O devices 340, interfaces 350, or other components (not shown). In some embodiments, processor 300 can be coupled to exchange data or commands with memory 310, design database 320, and value change database 330. For example, processor 300 can execute instructions that sends FPGA image data containing verification module 251a and 251b and a portion of DUT to FPGA chips 250a and 250b during prototype system downloads.

In accordance with some embodiments, more than one processor can be configured to operate independently or collaboratively. All processors can be of similar construction, or they can be of differing constructions electrically connected or disconnected from each other. As used herein, "construction" can include physical, electrical, or functional characteristics of the processor. Processors can be physically or functionally separate circuits or integrated in a single circuit. They can be coupled electrically, magnetically, optically, acoustically, mechanically, wirelessly or in any other way permitting communicated between them.

In accordance with some embodiments, memory 310 can be a computer readable memory, such as a random access memory (RAM), a read-only memory (ROM), a programmable read-only memory (PROM), a field programmable read-only memory (FPROM), a hard disk, an optical disk, a magnetic medium, a flash memory, other permanent, fixed, volatile memory, non-volatile memory, or any other tangible mechanism capable of providing instructions to processor 300 or similar component. For example, memory 310 can store instructions and data to perform verification functions on custom prototype board 230 in accordance with information stored in design database 320. Memory 310 can be distributed. That is, portions of memory 310 can be removable or non-removable, or located in geographically distinct locations.

In accordance with some embodiments, design database 320 can be a structured collection of tables, lists, or other data for design verification setup and runtime execution. As such, the structure can be organized as a relational database or an object-oriented database. In other embodiments, design database 320 can be a hardware system comprising physical computer readable storage media and input and/or output devices configured or be capable of being configured to receive and provide access to tables, lists, or other data structures. Further, configured as a hardware system design database 320 can include one or more processors and/or displays.

While similar in structure, value change database 330 can be configured or be capable of being configured to store information received from custom prototype board 230. For example, value change database can be configured or be capable of being configured to store information related to signal values captured by signal probes associated with verification modules 251a and 251b.

In accordance with some embodiments I/O devices 340 can be one or more of a mouse, stylus, keyboard, audio input/output device, imaging device, printing device, display device, sensor, wireless transceiver, or other similar device. I/O devices 340 can also include devices that provide data and instructions to memory 310, processor 300, design database 320, or value change database 330.

In accordance with some embodiments, interfaces 350 can include external or integrated interface card or interface port, such as PCI Express, Ethernet, FireWire®, USB, and wireless communication protocols. For example, interfaces 350 can be a PCI Express card coupled to communicate with emulation interface 220 using host communication channel 215. IO devices 340 can also include a graphical user interface, or other humanly perceivable interfaces configured to present data.

FIG. 4 illustrates a block diagram of an exemplary emulation interface 220 consistent with disclosed embodiments. By way of example, and as illustrated in FIG. 4, emulation interface 220 can include one or more of host-side interface 410, controller 400, signal converter 420, probe memory 440, transceiver 430, and prototype connectors 460a and 460b.

Host-side interface 410 can be similar to interfaces 350 and configured or be capable of being configured to facilitate communication with host workstation 210 using host communication channel 215. In other embodiments, host-side interface 410 can be different from interfaces 350, and can include physical or logical signal conversion components to facilitate communication with host workstation 210.

In accordance with some embodiments, controller 400 can be a component similar to processor 300. In some embodiments, controller 400 can act upon data or instructions received from host workstation 210 through host-side interface 410, signal converter 420, or custom prototype board 230 through transceiver 430 and at least one of prototype connectors 460a and 460b. For example, controller 400 can exchange commands and data with one or more verification modules 251 (for example, one or more of 251a and 251b) to control and monitor a device state associated with one or more of FPGA devices 250a and 250b. In some embodiments, the data can be signal values associated with probed signals. In other embodiments, controller 400 can send commands or data to at least one of verification modules, 251a and 251b, causing the at least one of verification modules to modify, among other things, the amount of data captured and the number or type of signals probed. As shown in FIG. 4, controller 400 can be coupled to receive data or instructions from probe memory 440 and transceiver 430. In some embodiments controller 400 can, for example, act upon instructions to send timing and control information to verification modules, 251a and 251b, located in each FPGA chip, 250a and 250b, on custom prototype board 230. Instructions can include, but not limited to, configuration parameters and runtime control information received from host-side interface 410.

Timing and control information can include, but not limited to, commands and data associated with probing signals to gather time-based or state-based information associated with a device or device state. Timing information can include clock signals generated, received, or processed by controller 400. Timing signals can also include start, stop, and reset signals. Received by verification module 251 (at least one of 251a and 251*b*), timing information can serve as basis to probe, capture, and process timing and state analysis data associated with a device under test. For example, timing and control information sent by controller 400 can provide a basis for creating a trigger sequence, capturing data from the device under test, assigning a time reference to captured data, sampling signal values, and configuring one or more signals within FPGA 250 (at least one of 250*a* and 250*b*) to be used as a clock when performing state analysis. In some embodiments, controller 400 can be configured or be capable of being configured to store data captured from FPGA chips, 250*a* and 250*b*, in probe memory 440. In some embodiments, the data received from FPGA chips, 250*a* and 250*b*, can be encoded. In some embodiments, the data received from FPGA chips, 250*a* and 250*b*, can be received from verification modules, 251*a* and 251*b*. Data can include timing data, state data, and meta data associated with the captured data. Meta data can include, among other things, a time reference or signal name. Captured data associated with a particular signal or signals stored in probe memory 440 can be compared to data associated with the same signal, but captured at a later time. In some embodiments, controller 400 can also be configured or be capable of being configured to encode and/or decode data exchanged with one or more verification modules 251*a* and 251*b* located in each FPGA chip, 250*a* and 250*b*.

Signal converter 420 can include a processor specifically configured or be capable of being configured to convert data exchanged over transceiver 430 into a suitable format for processing by host workstation 210.

Transceiver 430 can include any appropriate type of transmitter and receiver to transmit and receive data from custom prototype board 230. In some embodiments, transceiver 430 can include one or a combination of desired functional component(s) and processor(s) to encode/decode, modulate/demodulate, and to perform other functions related to the communication channel between emulation interface 220 and custom prototype board 230. Transceiver 430 can be coupled to communicate with custom prototype board 230 over emulation interface communication channel 450. In some embodiments, emulation interface communication channel 450 can utilize TDM (time-division-multiplexing) to exchange data with custom prototype board 230.

Prototype connectors 460*a* and 460*b* can be a J-connector or other connector type with signal transmission properties suitable to exchange commands and data between controller 400 and custom prototype board 230. Prototype connectors 460*a* and 460*b* can be configured or be capable of being configured to receive corresponding J-connector compatible cables 226*a* and 226*b*, respectively. In some embodiments, emulation interface 220 can include greater than or less than two prototype connectors in accordance with the particular system requirements. Emulation interface 220 can be configured or be capable of being configured to enable various logical configurations, both predefined and configurable, to physically connect to FPGA chips 250*a* and 250*b*.

Returning to FIG. 2, exemplary custom prototype board 230 can be a pre-fabricated or customized test board suitable for testing the design under test implemented in one or more FPGA chips 250*a* and 250*b*. By way of example, and as illustrated in FIG. 2, custom prototype board 230 can include one or more FPGA devices 250*a* and 250*b*, coupled to communicate with emulation interface 220 through connectors 222*a* and 222*b*, and 260*a* and 260*b*. Although depicted as two connectors, connectors 222 and 260 can be as few as one or more connectors, such as a J-connector or similarly suitable connector. Similarly, although depicted as including two FPGA devices 250*a* and 250*b*, custom prototype board 230 can have one or more FPGA devices 250 in accordance with the particular system requirements.

FIG. 5 illustrates custom prototype board 230 in more detail. By way of example, as illustrated in FIG. 5, custom prototype board 230 can include FPGA chips 250*a* and 250*b*, connectors 260*a* and 260*b*, interconnections 256*a* and 256*b*, and interconnections 255*ab*. Embodiments in accordance with custom prototype board 230 can be open systems in the sense that custom prototype board 230 can be customized in accordance with customer's specifications by, for example, custom designing interconnections 256*a* and 256*b*, and interconnections 255*ab*. Custom prototype board 230 can contain various numbers of FPGA chips (for example, FPGA chips 250*a*-250*n*) whose pins are interconnected in customer preferred configurations. In addition, custom prototype board 230 can contain a number of connectors 260*a* and 260*b* which are connected to FPGA chips 250*a* and 250*b* per customer's choice and in customer's preferred configurations. Embodiments in accordance with the current invention can utilize custom prototype board 230 by describing custom designed interconnections, and other custom configurations in user generated board description files.

In some embodiments, FPGA chips 250*a* and 250*b* pass along two clock signals to emulation interface 220. These two clocks are probe sampling system clock and probe sampling reference clock. The probe sampling system clock is used to support TDM (time-division-multiplexing) for probed signal values; and the probe sampling reference clock is used to designate a user clock period in which the sampling of signals to be probed constitutes a snapshot of a state in the circuit design at runtime. The probe sampling reference clock is used by controller 400 in emulation interface 220 to write the collected probe signal values into probe memory 440, and also to determine the next trigger state.

Probe sampling system clock and probe sampling reference clock are generated in one or more FPGA chips 250 (FPGA chips 250*a* and 250*b*) on custom prototype board 230, and are routed to verification module 251 (the corresponding verification module from 251*a* and 251*b* associated with the selected FPGA chip from 251*a* and 251*b*), then through appropriate FPGA pins to connector 260 (the corresponding connector from 260*a* and 260*b* associated with the selected FPGA chip from 251 and 251*b*), the cable 226 (the corresponding cable from 226*a* and 226*b* associated with the selected FPGA chip from 251*a* and 251*b*), and finally onto emulation interface 220. In some embodiments, both the probe sampling system clock signal and the probe sampling reference clock signal are passed to controller 400 of emulation interface 220. Controller 400 on emulation interface 220 might only need one FPGA on custom prototype board 230 to propagate the two clock signals and hence, any FPGA on custom prototype board 230 can provide the clocks, and typically, the first FPGA chip encountered in the board description files is chosen for this purpose.

In accordance with some embodiments, verification module 251 can be at least one of instrumentation circuitry and logic modules configured or be capable of being configured to perform traditional logic analysis instrumentation functions. Logic analysis functions performed by verification module 251, can include, for example, sampling of signal values, state analysis, protocol analysis, and triggering. In some embodiments, verification module 251 can be synthesizable or soft intellectual property (IP). Configuration parameters defining verification module 251 can be set during the design verification setup process, such as in a manner similar to flows for programming FGPA chips 250*a* and 250*b*. For example, during setup in some embodiments, the setup flow can automatically integrate third party synthesis and place and route tools, automatically or manually partition a design, and construct a design database for runtime software usage. A setup flow can include, for example, an automatic process for a pre-partitioned design, where the register transfer language (RTL) partitioning tool includes either a third party tool or a user's own manual partitioning. Alternatively or additionally, a setup flow can also include a flow where the user's design was not manually partitioned at the RTL level. In some embodiments, verification module 251 can be defined by Hardware Description Language (HDL) code and further verification module 251 can be merged with a partitioned portion of a circuit design to form an image data that can be downloaded to at least one of FGPA chips 250a and 250b. In some other embodiments, verification module 251 can be defined by netlist descriptions.

To optimize the physical pin resources available in a particular custom prototype board 230, verification module 251 comprises both design-dependent and design-independent circuitry. Throughout the detailed description, verification module 251 can refer to at least one of the verification modules 251a and 251b. For example, verification module 251 can include a design-dependent circuit, configured or be capable of being configured to connect to and probe specific signals. A probe or signal probe can include circuitry configured to analyze or sample the state of a particular signal. Utilizing access to design database 320 associated with the device under test, data dependent circuitry can be reconfigured during a test process to modify, remove, or add probes. In some embodiments, design database 320 can identify the signals to be probed by verification module 251 and also can identify the frequency of monitoring those signals to be probed. Verification module 251 can also include design-independent circuits configured or be capable of being configured to encode and decode data. For example, data-independent circuits can include, among other circuit types, first input first output (FIFO) and control state machine for sending data captured by verification module 251 to at least one of controller 400 and host workstation 210 for processing. Configuration parameters defining verification module 251 can be set during the design verification setup process.

Operationally, verification module 251 can respond to configuration parameters set during setup process or modified during testing. Based on these parameters, verification module 251 captures and sends a full design state snapshot of the portion of the device under test, performs cycle to cycle analysis, performs the required emulation. Data captured by verification module 251 can be post-processed by a computing device or component, such as emulation interface 220 or host workstation 210. Post processing can include, but not limited to, timing, state, and protocol analysis. Prior to processing data captured by verification module 251, captured data can be stored in value change database 330. In other embodiments, captured data can be stored in value change database 330 after processing.

FIG. 6 shows signals 600 to be probed which are coming from portions of user design in FPGA chips 250a and 250b on custom prototype board 230, and are destined to emulation interface 220. Signals 600 to be probed are sampled and passed on to emulation interface 220 by verification modules 251a and 251b. The board description files are referenced when verification modules 251a and 251b are created during setup flow. In FIG. 6, probe signals 600 are coupled with verification module 251a of FPGA 250a, and verification module 251a is configured or be capable of being configured in accordance with the board description files such that sampled probe signals 600 are propagated to appropriate FPGA pins of FPGA 250a, which then can travel through the connector 260a, cable 226a, and arrive at destination in emulation interface 220.

In some embodiments, board description files describe, among other things, interconnections 256a and 256b and also interconnections 255ab of custom prototype board 230. FIG. 7 shows an example of board connectivity description in Verilog HDL. In some other embodiments, the board connectivity description can be described in other HDLs like VHDL. VHDL, as known by one skilled in the art, is a HDL which stands for VHS IC Hardware Description Language The first line of the board description file of FIG. 7 is a module declaration, and is the top level view of custom prototype board 230. In the example board description file of FIG. 7, the module is named "custom_board." The module name is not relevant and a user can change it to any preferred name. The I/O ports of the module, for example, connector1_pins and connector2_pins as shown in FIG. 7 are relevant to properly describing custom prototype board 230. These are the pins corresponding to FPGAs, 250a and 250b, which are connected via cables 226a and 226b to emulation interface 220, and the pin order of the module has to match the order of actual connections between cables 226a and 226b with emulation interface 220. So, for example, if cables 226a and 226b connecting connectors 260a and 260b with connectors 222a and 222b are switched, then connector1_pins and connector2_pins in the module definition of the board description file also have to be switched. In some embodiments, cables, 226a and 226b can be used to couple custom prototype board 230 containing the at least one FPGA with emulation interface 220 and the cable connections can be described by the board description files.

As can be seen in the second line and third line of the module, the connector ports are declared, for example as, "inout[119:0]," comprising 120 pins each, and of In-Out type. As known by the one with ordinary skill in the art, In-Out type pins have the capability to act as either input or output pins. The number of pins on each connector, 260a and 260b, of custom prototype board 230 matches the number of pins on each connector, 222a and 222b, of emulation interface board 220. Each pin of connectors 260a and 260b is declared as In-Out type because each pin on FPGA 250a and 250b can be either an input pin or output pin depending on the configured images generated by the setup software at setup time. As described above, connector pins of connectors 222a and 222b also are defined as In-Out to match their counterparts on custom prototype board 230. Another reason for declaring connector pins as In-Out type is to not clutter the board description files by keeping them shorter, as understood by one skilled in the art. The I/O ports, connector1_pins and connector2_pins also correspond to the signals in interconnections 256a and 256b respectively. In addition to these I/O ports, board description files also include interconnections between FPGA chips on custom prototype board 230, for example interconnection 255ab corresponding to interconnection between FPGA 250a and FPGA 250b, which can be defined as local signals. As an example, board description file in FIG. 7 defines local_sig1 and local_sig2 as two interconnections between FPGA 250a and FPGA 250b. Even though only two local signals are defined in this exemplary embodiment, a user can define as many interconnections between FPGA chips as physically present on custom prototype board 230 for interconnecting FPGA pins.

The body of the board description file as exemplified in FIG. 7 comprises instances of FPGA chips. For example, the exemplary embodiment as illustrated by FIG. 7 shows two FPGA instances, F1 and F2, which are of FPGA type, xc5vlx330, corresponding to FPGA 250*a* and 250*b* of custom prototype board 230. The type of FPGA chips used can be defined in a separate board description file as illustrated in FIG. 8. Referring back to the exemplary board connectivity description of FIG. 7 Pins on each FPGA instance, F1 and F2, are connected to connectors or other FPGA chips. Declarations of I/O ports, instances and connections on instance pins and I/O ports together constitute a complete description of board level connectivity and FPGA resources. By consulting the board description files, as exemplified by FIGS. 7 and 8, setup software can prepare configured images that can be downloaded to the FPGA chips on custom prototype board 230 to emulate the user design. In some embodiments, the configured images can be created by a place and route software associated with at least one of FPGA 250*a* and FPGA 250*b*.

The board level connectivity as illustrated by board description file illustrated in FIG. 7 is an important aspect of custom prototype board 230. We also need to know other information pertaining to custom prototype board 230, as illustrated by FIG. 8. An example is FPGA device type. For this purpose, a separate file is used, such as the one shown in FIG. 8. custom_board.F1 is a hierarchical instance name, and is referring to the F1 instance in the Verilog file of FIG. 7. The following line describes the device type of custom_board.F1 as xc5vlx330-ff1760. This information can signify whether the type of FPGAs used, for example, is a member of XIlinx™ Vertex family or a member of Altera™ Strata family. From this device type description, the setup software can know the characteristics of the FPGA chip on custom prototype board 230, and will generate the configured image accordingly. In some embodiments, the board description file as exemplified by FIG. 8 need not be in a hardware description language like Verilog or VHDL.

Before running emulation of circuit design, the configured images have to be downloaded to FPGA chips, 250*a* and 250*b*, on custom prototype board 230. In some embodiments, the user designs custom prototype board 230 such that it has its own download bus, which might mean that emulation interface 220 need not be involved in downloading the configured images. In other embodiments, where a dedicated download bus is not included on custom prototype board 230, a special connector in emulation interface 220 can be reserved for this purpose. In some embodiments board description files can include description of the download bus or the special connector. In other embodiments, the download bus or the special connector is not described in board description files. Instead, the user can use a runtime command to tell the prototype system 200 whether the configured image data is to be downloaded into custom prototype board 230 either using its own download bus or the special connector of emulation interface 220.

The current disclosed embodiments provide users with great freedom in customizing their prototype board designs to suit their needs. In addition, it offers users flexibility in many things, such as, for example, re-cabling. In some situations, a given FPGA (for example, either 250*a* or 250*b*) on custom prototype board 230 can connect to more than one connectors, 260*a* and 260*b*. As an example, FPGA 250*a* can connect to emulation interface 220 through connectors 260*a* and 260*b*. The user has the freedom of using a cable (for example, cable 226*a* or 226*b*) to connect one of the connectors on each FPGA to emulation interface 220, and describe the connectivity in board description files that reflects the cabling accordingly. Later, if the user needs to switch a cable to a different connector, say, to make room for mounting some custom parts on the board, it is straight forward to do so. The user can modify the description in the board description files to reflect the change in cabling, and re-run the setup flow to update the custom prototype system configuration. By referencing the new description in the board description files, the setup flow will automatically configure a new image data for downloading. Likewise, if the user would like to swap cables, it can also be done in a similar manner.

In some embodiments, a user can increase the number of signal probes on an FPGA, for example, FPGA 250*a* through cabling. If the user has originally connected only one connector (for example, 260*a*) on FPGA 250*a* to emulation interface 220, and later decided to probe more signals on FPGA 250*a*, it can be accomplished by connecting a second connector, for example, 260*b* (and its corresponding connector 222*b* on emulation interface 220) from emulation interface 220 to FPGA 250*a*. Then, the user can simply modify the connectivity description in the board description files, and re-run setup to generate updated configured images and send them to FPGA 250*a* for emulation. Note that in some situations, using a second cable to connect a second connector to emulation interface 220 can only be accomplished by unplugging a cable from some other FPGA on custom prototype board 230.

FIG. 9 depicts a setup flow chart, and FIG. 10 depicts a runtime flowchart. The setup flow represents an exemplary method performed by a host workstation for configuring image data representative of at least a portion of a circuit design to be emulated by a custom prototype system. The runtime flow of FIG. 10 generally follows the setup flow in one embodiment. Starting with downloading FPGA images to the custom prototype board, the runtime flow shows an exemplary custom prototype system emulating the circuit design, receiving, processing and storing probed signal values, and then uploading to the host workstation for further processing and debugging. While the flowchart discloses the following steps in a particular order, some of the steps can be moved, modified, or skipped in various embodiments and depending on the applications.

The host workstation, in step 905, can be configured or be capable of being configured to receive at least a portion of the circuit design to be emulated on the customer prototype board and a list of signals to observe. In some embodiments, the received circuit design can be a block of a System-On-Chip (SOC) design and in other embodiments it can be the whole SOC design. The list of signals are to be probed at runtime for debugging purpose.

The host workstation can comprise a software program comprising a series of instructions embodied on a computer-readable medium of the host workstation, the software program being configured or be capable of being configured to provide, when executed, to at least one field programmable gate array ("FPGA") on the custom prototype board, runtime control information and image data representative of at least a portion of the circuit design to be emulated and an verification module, the image data based at least in part on information in at least one board description file.

An emulation interface can be configured or be capable of being configured to be coupled between the host workstation and the custom prototype board, the emulation interface being configured or be capable of being configured to provide timing and control information to at least a first portion of at least one FPGA implementing at least a portion of the circuit design and the verification module based on at least one image data and runtime control information received from the host workstation through a host interface. In some embodiments, the interface can be configured or be capable of being configured to provide timing and control information to at least a verification module associated with the at least one FPGA. In some embodiments, the interface can comprise a controller and a memory, the memory being configured or be capable of being configured to store probed signal values from at least a portion of the at least one FPGA implementing at least a portion of the emulated circuit design, wherein the verification module can be configured or be capable of being configured to provide the probed signal values, and the controller can be configured or be capable of being configured to receive and process the probed signal values. In some embodiments, timing information can include clock signals generated from or processed by the emulation interface component. In some embodiments, control information can include information associated with an analysis trigger sequence or condition. Control information can include, but not limited to, commands associated with creating signal probes for analysis of selected signals.

After receiving at least a portion of circuit design, in step 910, the design is partitioned into smaller portions of circuit design such that each of the smaller units can fit in an FPGA chip on the custom prototype board. The partition step is based on the following information including, among others, board description files and user constraints. Board description files can describe the connectivity information of the custom prototype board and can also describe the various interconnections between different FPGAs on the custom prototype board and also interconnections between each FPGA and the emulation interface. In some embodiments, board description file can comprise at least one of Verilog description and VHDL description.

Board description files can also describe, among others, the type of FPGAs and the number of FPGAs used on the custom prototype board. User constraints can at least include probe signal names, probe sampling system clock name, probe sampling reference clock name, probe sampling system clock rate, probe sampling reference clock rate, target system clock rate, etc. Each partitioned unit of the circuit design can be assigned to a specific FPGA chip on the custom prototype board, and can to be combined with a specific verification module, which can be created and configured or be capable of being configured in step 915, to form a downloadable image for the specific FPGA chip.

After partitioning the circuit design, in step 915, the verification module can be generated, wherein the verification module can be configured or be capable of being configured to control at least a portion of the emulated circuit design and to receive and monitor signals to be probed representing internal states of the portion of the emulated circuit design. For example, controlling the device under test can include setting value or sampling of a predetermined set of signals to be probed based on timing information received from the emulation interface. In some embodiments, sampling can be performed synchronously. In other embodiments, sampling can be performed asynchronously. In some embodiments, the verification module can be defined by HDL code, and merged with a partitioned portion of a circuit design to form an image data that can be downloaded to at least one FGPA chip. In some other embodiments, the verification module can be defined by netlist descriptions, such as EDIF.

These verification modules sample signals to be probed and route the sampled signals to the appropriate pins of the FPGA chip and then to the corresponding pins of the connector coupled with the FPGA chip and later to the emulation interface for processing. In some embodiments, time division multiplexing (TDM) can be employed to improve the speed of passing on the sampled signals to the emulation interface, which also enables the custom prototype system to increase the number of signals to be probed it can pass on in a given time. In some embodiments, probe signal values are supplied to the controller by at least a second portion of the at least one FPGA of the custom prototype board, and at least one probe sampling system clock signal and at least one probe sampling reference clock signal are supplied to the controller by at least a third portion of the at least one FPGA.

In some embodiments, the emulation interface can be configured or be capable of being configured to receive commands from the host workstation to reconfigure the functionality of the verification modules. In reconfiguring the functionality of the verification modules, the emulation interface, can send commands received from the host workstation operable to reconfigure the number, type, and manner in which signals to be probed can be analyzed based on circuit design information included in the design database. In other embodiments, the emulation interface can send commands received from the host workstation operable to reconfigure a portion of the circuit design separately or in addition to commands leading to the reconfiguration of the verification module.

The verification module can monitor predetermined signals to be probed within the device under test. For example, the verification module can include probes configured to analyze one or more signals to be probed. Alternatively or additionally, the verification module can capture information representative of a device state associated with the device under test. For example, the verification module can include a design-dependent circuit, equipped with probes to capture data associated with specific signals to be probed. Utilizing access to the design database associated with the device under test, the verification module can be reconfigured during a test process to modify, remove, or add probes to capture the same or different signals to be probed. In some embodiments, the design database can identify the signals to be probed by the verification module and also can identify the frequency of monitoring those signals to be probed.

Configuration parameters defining the verification module can be used to determine which signal can be probed. These parameters can be set during the design verification setup process. Alternatively, the verification module can be modified during testing. Based on these parameters, the verification module can capture and send a full design state snapshot of the device under test, perform cycle to cycle analysis and capture, perform co-simulation or co-emulation, and incrementally modify which signals are probed. Alternatively or additionally, data captured by the verification module can be processed by a computing device or component, such as the emulation interface or the host workstation. In some embodiments, a portion of the verification module can either receive or transmit at least one of the signals to be probed, at least one of the probe sampling system clock signals, and at least one of the probe sampling reference clock signals.

In step 920, the partitioned circuits and verification modules go through a placement and route (P&R) flow, which refers to mapping of the netlist that is partitioned and inserted with the verification module, to registers, memories, interconnects, and pins of the target FPGA on the custom prototype board. The P&R flow is based on information from board description files and partitioned net lists.

In step 925, a first configured image representative of at least a portion of the circuit design and an verification module is generated. This first configured image is based at least in part on the first set of descriptions between the at least one FPGA and the emulation interface and also based on the information in the board description files. In some embodiments, the first configured image comprises a number of signals to be probed to be controlled and monitored by the custom prototype system.

Then, the runtime flow starts as depicted in FIG. 10. In step 1005, the first configured image is communicated with at least one of the FPGAs of the custom prototype board. In some embodiments, a pre-existing image representative of at least another portion of the circuit design is associated with another FPGA of the custom prototype board. Pre-existing images, if any, are also communicated with their associated FPGAs of the custom prototype board in step 1005.

In step 1010, the signal values associated with probed signals from the verification module are received at the emulation interface, wherein the probed signal values are associated with at least a portion of the circuit design being emulated. The emulation interface can be coupled to the custom prototype board through the at least one connector and the emulation interface can be configured or be capable of being configured to provide timing and control information to at least a portion of the custom prototype board. The emulation interface can further comprise a controller and a memory device, wherein the controller can be configured or be capable of being configured to receive and process the probed signal values. In step 1015, the received probed signal values can be processed by the controller of the emulation interface. Next, in step 1020, the probed signal values can be stored in the memory device of the emulation interface. In step 1025, the processed information associated with the probed signal values can be transmitted from the emulation interface to the host workstation.

To illustrate the setup and runtime process as depicted in FIGS. 9 and 10, an exemplary embodiment is described below. For example, a custom prototype board comprising two FPGA chips may be used in one embodiment. A circuit design to be emulated may be received, in step 905, as a Verilog text file, for example, "MyDesign.v" in one embodiment. The text file, "MyDesign.v," can be partitioned, in step 910, into two files, "MyDesignSub1.v" and "MyDesignSub2.v," and each may contain a part of the circuit design to be emulated. As an example, the circuit design may include a CPU and a Codec. The circuit descriptions may be initially specified in the text file, "MyDesign.v." In some examples, a user may partition the circuit design such that the circuit descriptions associated with the CPU can be in FPGA 1 and that of the Codec can be in FPGA 2, such that the descriptions for the CPU in "MyDesign.v" can be included in "MyDesignSub1.v," and the remaining descriptions, presumably for the Codec, can be included in "MyDesignSub2.v."

Next, additional circuit descriptions, serving as verification modules, can be added into "MyDesignSub1.v," and "MyDesignSub2.v," which can provide timing and control information to the FPGA 1 and FPGA 2, respectively. The additional circuit descriptions can also include probe signal values in CPU and Codec respectively, which can be communicated with the emulation interface, e.g., an Interface Card. The additional descriptions are for defining or describing "Verification Modules.". For example, the additional circuit descriptions of the "MyDesignSub1.v," file can be referred as "Verification Module 1," and that of "MyDesignSub2.v," as "Verification Module 2." In some embodiments, "Verification Module 1" can be different from "Verification Module 2," because "Verification Module 1" works with the CPU portion, and "Verification Module 2" works with the Codec portion. The verification modules, "Verification Module 1" and "Verification Module 2," can be configured or be capable of being configured in step 915.

Next, in steps 920 and 925, the partitioned circuit design as illustrated by, "MyDesignSub1.v" (comprising the CPU and Verification Module 1) and "MyDesignSub2.v" (comprising the Codec and Verification Module 2) can go through a host software or application, such as a Place and Route software, to generate two downloadable binary images, for example, "MyDesignSub1.bin," and "MyDesignSub2.bin," which may be representative of the circuit to be emulated.

Next, in step 1005, the two images can be communicated to FPGA 1 and FPGA 2 on the custom prototype board. For example, "MyDesignSub1.bin" can be downloaded into FPGA 1 and "MyDesignSub2.bin" can be downloaded into FPGA 2. In step 1010, the signal values associated with probed signals from the verification modules, for example, "Verification Module 1" and "Verification Module 2," may be received (e.g., read, accessed, or otherwise retrieved) by the emulation interface, wherein the probed signal values are associated with at least a portion of the circuit design being emulated. In step 1015, the received probed signal values, associated with "MyDesign.v," can be processed by the controller of the emulation interface. Next, in step 1020, the processed probed signal values, associated with "MyDesign.v," can be stored in the memory device of the emulation interface. In step 1025, the processed information associated with the probed signal values, associated with "MyDesign.v," can be transmitted from the emulation interface to the host workstation.

It will be appreciated by those skilled in the art that changes, modifications, variations, and/or adjustments can be made to the disclosed embodiments described above without departing from the concepts or examples disclosed herein. Therefore, the disclosed embodiments are not limited to the particular embodiments disclosed, but are intended to cover changes, modifications, variations, and/or adjustments consistent with the spirit and scope of the disclosed embodiments as described by the claims that follow.

What is claimed is:

1. A system for emulating a circuit design, the system comprising:
   a custom prototype board comprising at least one field programmable gate array ("FPGA") for emulating the circuit design, the at least one FPGA of the custom prototype board being capable of emulating at least a portion of the circuit design, the at least one FPGA also being capable of being configured to include a verification module that provides timing and control information to the at least a portion of the circuit design and probing signals associated with the at least a portion of the circuit design, the custom prototype board being described by at least one board description file;
   a host workstation capable of providing image data representative of the at least a portion of the circuit design being emulated and of the verification module, the image data being based at least in part on the at least one board description file and to be downloaded to the at least one FPGA on the custom prototype board; and
   an emulation interface coupled between the host workstation and the custom prototype board, the emulation interface being capable of providing timing and control information to at least the verification module, the emulation interface comprising a controller and a memory device, wherein the controller is capable of being configured to receive and process signal values associated with the probed signals to store the processed signal values in the memory device.

2. The system of claim 1, wherein the verification module is a module defined by VHDL, HDL, Verilog, or netlist descriptions, the verification module being merged with a partitioned portion of the circuit design to form the image data downloaded to the at least one FPGA.

3. The system of claim 1, wherein a runtime database identifies at least the signals to be probed by the verification module and a frequency of monitoring those signals to be probed.

4. The system of claim 1, wherein the image data is created by a place and route software associated with the at least one FPGA.

5. The system of claim 1, wherein at least a first portion of the custom prototype board supplies the probed signals in an encoded form to the controller, and at least a second portion of the custom prototype board supplies at least one probe sampling system clock signal and at least one reference clock signal to the controller.

6. The system of claim 1, wherein the at least one board description file comprises at least one of Verilog description and VHDL description.

7. An emulation interface comprising:
a controller coupled between a host workstation and a custom prototype board, the controller being capable of receiving, after configuration, signal values associated with probed signals from a verification module of the custom prototype board, the custom prototype board being external to the emulation interface and comprising at least one field programmable gate array ("FPGA") being capable of being configured to include the verification module, the probed signal values being associated with at least a portion of a circuit design being emulated by the custom prototype board; and
a memory device coupled with the controller to store information associated with the probed signal values, wherein the custom prototype board being described by at least one board description file, and the controller being capable of being configured to provide timing and control information to at least the verification module.

8. The emulation interface of claim 7, wherein at least a first portion of the custom prototype board supplies the probed signals in an encoded form to the controller, and at least a second portion of the custom prototype board supplies at least one probe sampling system clock signal and at least one reference clock signal to the controller.

9. A method for emulating a circuit design, the method comprising:
receiving, at an emulation interface, signal values associated with probed signals from a verification module of a custom prototype board, the custom prototype board being external to the emulation interface and comprising at least one field programmable gate array ("FPGA"), the at least one FPGA of the custom prototype board being capable of being configured to emulate at least a portion of the circuit design and being capable of being configured to provide the verification module, the custom prototype board being described by at least one board description file;
processing, by the emulation interface, the probed signal values, the probed signal values being associated with at least a portion of the circuit design being emulated, the emulation interface being coupled between a host workstation and the custom prototype board, the emulation interface being capable of being configured to provide timing and control information to at least the verification module, the emulation interface comprising a controller and a memory device, the controller being capable of being configured to receive the probed signal values;
storing, by the emulation interface, processed information from processing the probed signal values by the controller; and
transmitting, by the emulation interface, the processed information to the host workstation.

10. The method of claim 9, wherein the verification module is merged with a partitioned portion of the circuit design to form an image data to be downloaded to the at least one FPGA, the verification module being defined by VHDL, HDL, Verilog, or netlist descriptions.

11. The method of claim 10, wherein the image data is created by a place and route software associated with the at least one FPGA.

12. The method of claim 9, wherein the receiving the signal values associated with probed signals is facilitated by a runtime database that identifies at least the signals to be probed and a frequency of monitoring those signals to be probed.

13. The method of claim 9, wherein the at least one board description file comprises VHDL, HDL, Verilog, or netlist descriptions.

14. The method of claim 9, further comprising, before receiving the signal values associated with the probed signals, configuring the custom prototype board to provide the verification module.

15. A non-transitory computer-readable medium comprising instructions that, when executed, causes a computer to perform a method for emulating a circuit design, the method comprising:
receiving, at an emulation interface, signal values associated with probed signals from a verification module of a custom prototype board, the custom prototype board being external to the emulation interface and comprising at least one field programmable gate array ("FPGA"), the at least one FPGA of the custom prototype board being capable of being configured to emulate at least a portion of the circuit design and being capable of being configured to include the verification module, the custom prototype board being described by at least one board description file;
processing, by the emulation interface, the probed signal values, the probed signal values being associated with at least a portion of the circuit design being emulated, the emulation interface being coupled between a host workstation and the custom prototype board, the emulation interface being capable of being configured to provide timing and control information to at least the verification module, the emulation interface comprising a controller and a memory device, the controller being capable of being configured to receive the probed signal values;
storing, by the emulation interface, processed information from processing the probed signal values by the controller; and
transmitting, by the emulation interface, the processed information to the host workstation.

16. The computer-readable medium of claim 15, wherein the verification module is merged with a partitioned portion of the circuit design to form an image data to be downloaded to the at least one FPGA, the verification module being defined by VHDL, HDL, Verilog, or netlist descriptions.

17. The computer-readable medium of claim 16, wherein the image data is created by a place and route software associated with the at least one FPGA.

18. The computer-readable medium of claim 15, wherein the receiving the signal values associated with probed signals is facilitated by a runtime database that identifies at least the signals to be probed and a frequency of monitoring those signals to be probed.

19. The computer-readable medium of claim 15, wherein the at least one board description file comprises VHDL, HDL, Verilog, or netlist descriptions.

20. The computer-readable medium of claim 15, the method further comprising, before receiving the signal values associated with the probed signals, configuring the custom prototype board to provide the verification module.

21. A system for emulating a circuit design, the system comprising:
a custom prototype board comprising at least one field programmable gate array ("FPGA") for emulating the circuit design, the at least one FPGA of the custom prototype board being configured to emulate at least a portion of the circuit design, the at least one FPGA also being configured to include a verification module that provides timing and control information to the at least a portion of the circuit design and probing signals associated with the at least a portion of the circuit design, the custom prototype board being described by at least one board description file;
a host workstation configured to provide image data representative of the at least a portion of the circuit design being emulated and of the verification module, the image data being based at least in part on the at least one board description file and to be downloaded to the at least one FPGA on the custom prototype board; and
an emulation interface coupled between the host workstation and the custom prototype board, the emulation interface being configured to provide timing and control information to at least the verification module, the emulation interface comprising a controller and a memory device, wherein the controller being configured to receive and process signal values associated with the probed signals to store the processed signal values in the memory device.

22. An emulation interface comprising:
a controller coupled between a host workstation and a custom prototype board, the controller being configured to receive, after configuration, signal values associated with probed signals from a verification module of the custom prototype board, the custom prototype board being external to the emulation interface and comprising at least one field programmable gate array ("FPGA") being configured to include the verification module, the probed signal values being associated with at least a portion of a circuit design being emulated by the custom prototype board; and
a memory device coupled with the controller to store information associated with the probed signal values, wherein the custom prototype board being described by at least one board description file, and the controller being configured to provide timing and control information to at least the verification module.

23. A method for emulating a circuit design, the method comprising:
receiving, at an emulation interface, signal values associated with probed signals from a verification module of a custom prototype board, the custom prototype board being external to the emulation interface and comprising at least one field programmable gate array ("FPGA"), the at least one FPGA of the custom prototype board being configured to emulate at least a portion of the circuit design and being configured to include the verification module, the custom prototype board being described by at least one board description file;
processing, by the emulation interface, the probed signal values, the probed signal values being associated with at least a portion of the circuit design being emulated, the emulation interface being coupled between a host workstation and the custom prototype board, the emulation interface being configured to provide timing and control information to at least the verification module, the emulation interface comprising a controller and a memory device, the controller being configured to receive the probed signal values;
storing, by the emulation interface, processed information from processing the probed signal values by the controller; and
transmitting, by the emulation interface, the processed information to the host workstation.

24. A non-transitory computer-readable medium comprising instructions that, when executed, causes a computer to perform a method for emulating a circuit design, the method comprising:
receiving, at an emulation interface, signal values associated with probed signals from a verification module of a custom prototype board, the custom prototype board being external to the emulation interface and comprising at least one field programmable gate array ("FPGA"), the at least one FPGA of the custom prototype board being configured to emulate at least a portion of the circuit design and being configured to include the verification module, the custom prototype board being described by at least one board description file;
processing, by the emulation interface, the probed signal values, the probed signal values being associated with at least a portion of the circuit design being emulated, the emulation interface being coupled between a host workstation and the custom prototype board, the emulation interface being configured to provide timing and control information to at least the verification module, the emulation interface comprising a controller and a memory device, the controller being configured to receive the probed signal values;
storing, by the emulation interface, processed information from processing the probed signal values by the controller; and
transmitting, by the emulation interface, the processed information to the host workstation.

* * * * *